(12) United States Patent
Cohen et al.

(10) Patent No.: US 9,202,004 B1
(45) Date of Patent: Dec. 1, 2015

(54) SYSTEM, METHOD, AND COMPUTER PROGRAM PRODUCT FOR ENSURING THAT EACH SIMULATION IN A REGRESSION IS RUNNING A UNIQUE CONFIGURATION

(71) Applicant: Cadence Design Systems, Inc., San Jose, CA (US)

(72) Inventors: Daniel A. Cohen, Los Gatos, CA (US); John LeRoy Pierce, Temple, NH (US); Nir Weiss, San Diego, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 14/449,347

(22) Filed: Aug. 1, 2014

(51) Int. Cl.
*G06F 17/50* (2006.01)

(52) U.S. Cl.
CPC .................. *G06F 17/5081* (2013.01)

(58) Field of Classification Search
CPC .............. G06F 17/505; G06F 17/5054; G06F 17/5068; G06F 17/5022; G06F 17/5081; G06F 17/5031; G06F 17/5077; G06F 2217/12; G06F 2217/84; G06F 11/27; G06F 17/504; Y02T 10/82

USPC .................................................. 716/100–109
See application file for complete search history.

(56) References Cited

U.S. PATENT DOCUMENTS

2007/0271545 A1* 11/2007 Eng ................................ 716/18
2010/0070935 A1* 3/2010 Bist et al. ......................... 716/4

* cited by examiner

*Primary Examiner* — Binh Tat
(74) *Attorney, Agent, or Firm* — Mark H. Whittenberger, Esq.; Holland & Knight LLP

(57) ABSTRACT

The present disclosure relates to a computer-implemented method for electronic design verification. Embodiments may include providing an electronic design including, at least in part, one or more hardware description languages and one or more software programming languages. Embodiment may also include calculating, using one or more processors, configuration information without analyzing the electronic design, wherein the configuration information includes one or more memory elements configured to control a mode of operation of the electronic design. Embodiments may further include storing a seed for each configuration, wherein each seed may be configured to cause a constraint solver to set a defined set of values for one or more random variables in a class associated with the seed.

20 Claims, 13 Drawing Sheets

SYSTEM, METHOD, AND COMPUTER PROGRAM PRODUCT FOR ENSURING THAT EACH SIMULATION IN A REGRESSION IS RUNNING A UNIQUE CONFIGURATION

FIELD OF THE INVENTION

The present disclosure relates to electronic designs, and more specifically, to a method for describing, measuring, verifying and covering a configuration space associated with an electronic design.

DISCUSSION OF THE RELATED ART

In the world of electronic design automation ("EDA"), many different approaches have been used in order to verify the operation of an integrated circuit ("IC"). Customers run tens of thousands of simulations to verify their designs. This takes thousands of hours and generates hundreds of gigabytes of data. At the end they are still not sure if they have run enough simulations and have no way to predict how many simulations they need to run before running them. Existing approaches also fail to adequately predict the impact of adding another mode or field on the number of required simulations. Coverage must be manually written to understand how much of the stimulus they need to generate has actually been generated. As random fields and constraint rules are added to their stimulus there is no way to predict the impact on the number of tests they need to run to achieve coverage.

Newer methods for IC verification have appeared as IC complexity has increased. In this way, simulation approaches began as a directed test where static tests were configured to provide complete stimulus for every IC function. In time, and as shown in FIG. 1, the transition to randomization revolutionized the way in which testing was performed. Dynamic tests may provide a random stimulus to supply an acceptable subset of input for every IC function. Automatic test pattern generation ("ATPG") supplanted fault simulation when the manual tuning of test vectors became too complex (late 1990s) and hardware verification languages ("HVLs") were developed to support randomized test with constraints, coverage, and classes (early 2000s). These improvements significantly increased the engineer's ability to build tests.

Today, and as shown in FIG. 2, randomization has difficulty scaling and is becoming increasingly insufficient as the state space continues to grow exponentially. The current state space is absurdly large (e.g., 1 M register bits=10^300000 number of states, 30K registers @ 32bits~1M bits>many chips are already there). Accordingly, verification farms are starting to limit testability as more machines simply means more tests and the associated physical limits (and cloud security) constrain test scaling. Coverage attempts to measure but even that is stressed as verification plans define functions to be verified and crosses attempt to connect dependent requirements. Moreover, the coverage definition is a manual process, which only adds to the problem.

Similarly, locating bugs is becoming increasingly difficult as IC complexity exceeds verification computing power. Existing techniques such as mutation-based testing act merely as an insurance policy. The designer may not know how many runs are needed to achieve appropriate distribution and tests inevitably overlap, which generates questions as to how the ranking helps complex verification. Determining what tests are critical to assess basic functionality and the possibility of false-positive regression is also possible (e.g. if 1 bit added to the configuration register, etc.). Furthermore, prior attempts at automated coverage closure technologies have failed.

Further, customers are often using constrained random test benches that use a constraint solver engine to randomize, which configuration of the design they will run as well as what random data they will want to push through the design to test it. Today, each test is launched with a random seed and no relationship to the other tests. As a result, many tests run the same configuration, which requires repeated testing.

SUMMARY OF DISCLOSURE

In one or more embodiments of the present disclosure, a computer-implemented method for electronic design verification is provided. The method may include providing an electronic design including, at least in part, one or more hardware description languages and one or more software programming languages. The method may also include calculating, using one or more processors, configuration information without analyzing the electronic design, wherein the configuration information includes one or more memory elements configured to control a mode of operation of the electronic design. The method may further include storing a seed for each configuration, wherein each seed may be configured to cause a constraint solver to set a defined set of values for one or more random variables in a class associated with the seed.

One or more of the following features may be included. In some embodiments, the method may further include passing each seed to the constraint solver and matching each seed with a particular constraint solve call. In some embodiments storing a seed may include storing a seed associated with a constraint solve call. The method may further include providing an application programming interface configured to allow for at least one of storing the seed and passing each seed to the constraint solver to seed a specific constraint solve. In some embodiments, storing may include storing each seed for each of a plurality of constraint solve calls.

In one or more embodiments of the present disclosure a computer-readable storage medium having stored thereon instructions, which when executed by a processor result in one or more operations for electronic design verification. Operations may include providing an electronic design including, at least in part, one or more hardware description languages and one or more software programming languages. Operations may also include calculating, using one or more processors, configuration information without analyzing the electronic design, wherein the configuration information includes one or more memory elements configured to control a mode of operation of the electronic design. Operations may further include storing a seed for each configuration, wherein each seed may be configured to cause a constraint solver to set a defined set of values for one or more random variables in a class associated with the seed.

One or more of the following features may be included. In some embodiments, operations may further include passing each seed to the constraint solver and matching each seed with a particular constraint solve. In some embodiments storing a seed may include storing a seed associated with a constraint solver call. Operations may further include providing an application programming interface configured to allow for at least one of storing the seed and passing each seed to the constraint solver. In some embodiments, storing may include storing each seed for each of a plurality of constraint solve calls.

In some embodiments, a system for electronic design verification is provided. The system may further include one or more processors configured to receive an electronic design including, at least in part, one or more hardware description languages and one or more software programming languages. The one or more processors may be further configured to calculate configuration information without analyzing the electronic design, wherein the configuration information includes one or more memory elements configured to control a mode of operation of the electronic design. The one or more processors may be further configured to store a seed for each configuration, wherein each seed may be configured to cause a constraint solver to set a defined set of values for one or more random variables in a class associated with the seed.

One or more of the following features may be included. The one or more processors may be further configured to pass each seed to the constraint solver and match each seed with a particular constraint solve. In some embodiments storing a seed may include storing a seed associated with a constraint solver call. Operations may further include providing an application programming interface configured to allow for at least one of storing the seed and passing each seed to the constraint solver.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

DETAILED DESCRIPTION

Figure 1:
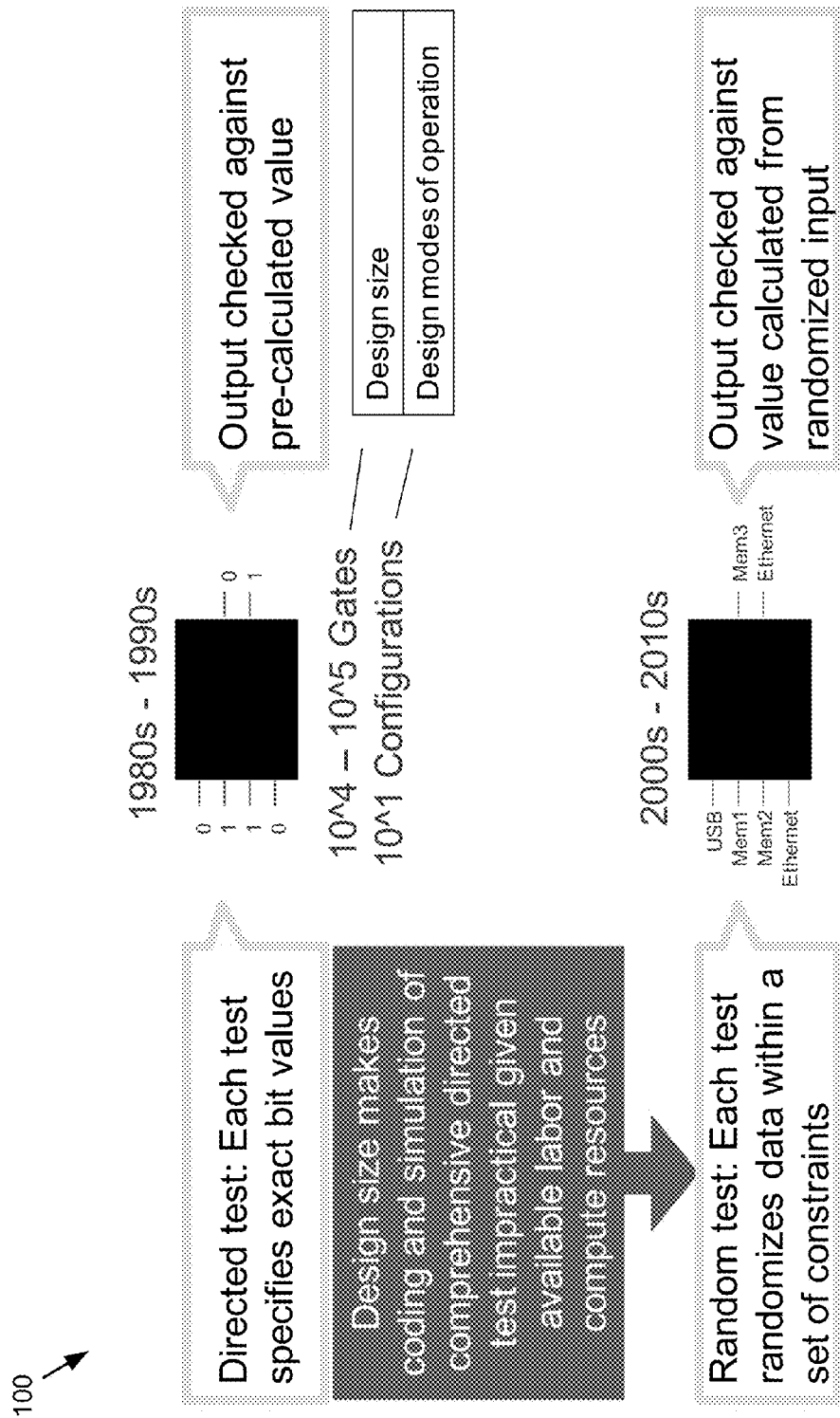
FIG. 1 is a diagram depicting existing verification processes.
Figure 2:
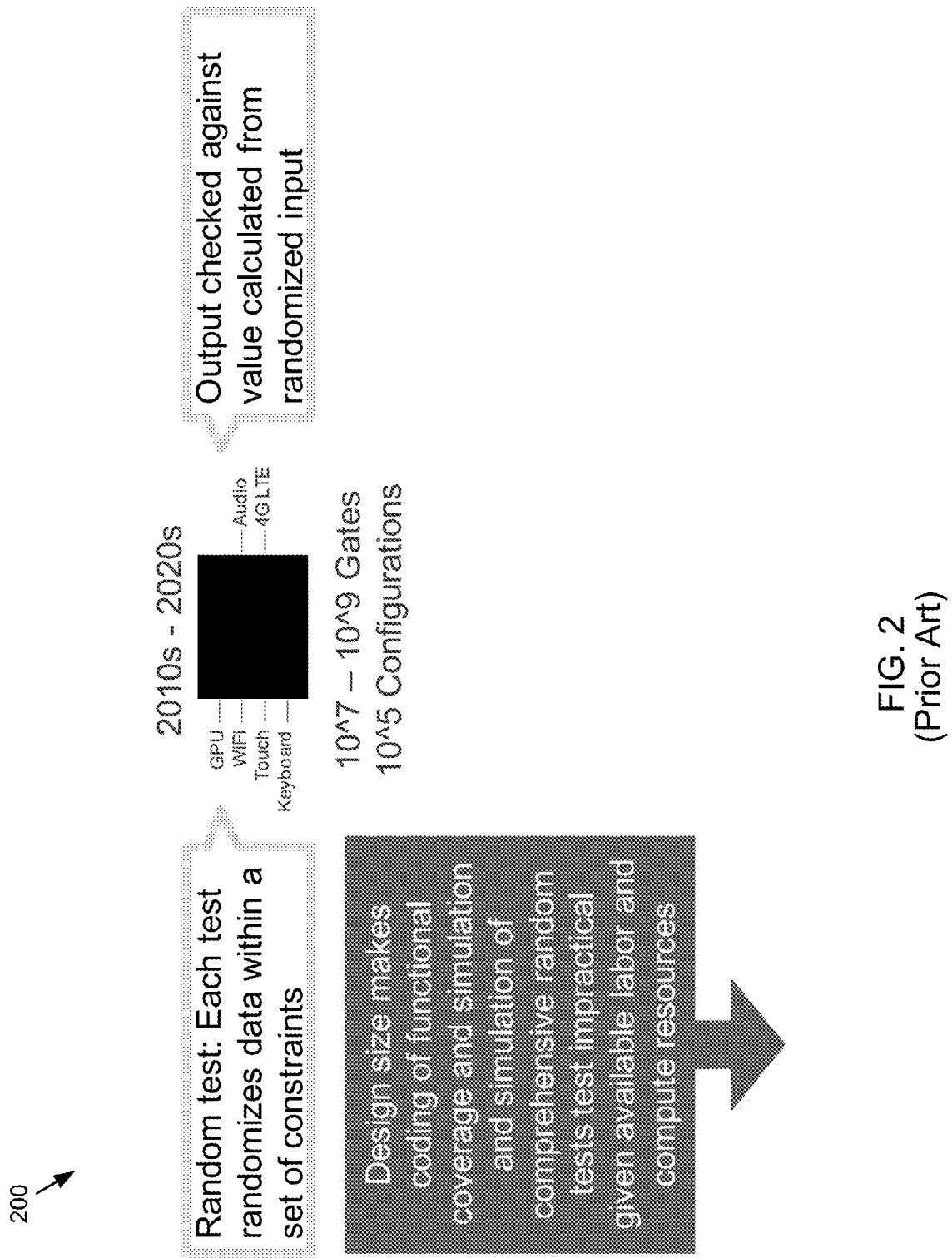
FIG. 2 is a diagram depicting existing verification processes.

Embodiments of verification process 10, discussed below in further detail, may run the configurations at a high speed to predict the number of tests and to identify parts of the configuration space most sensitive to changes in the configuration fields or constraints. A more focused set of simulations may then be run to maximize both coverage results and available computational resources. Existing solutions involved performing massive regressions and reviewing the coverage improvement for each batch of tests (e.g., 1000, 2000, 3000 . . . 10,000) or to set an arbitrarily high number for each batch of tests in hopes that it would be sufficient. Both existing approaches left some configurations over-tested and others under-tested. If the design, configuration fields or constraints change (even a minor change) then this can have a large impact on the results so these existing techniques lacked reliability. Some embodiments include a mechanism that may be used to ensure that each simulation in a regression is running a unique configuration.

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

As used in any embodiment described herein, "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof.

As used in any embodiment herein, the terms "simulation" and "verification" may refer to the concept of testing an electronic design and may include any actions performed by a software or hardware engine.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium may include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations of the present invention may be written in an object oriented programming language such as Java, Smalltalk, C++ or the like. However, the computer program code for carrying out operations of the present invention may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present disclosure is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

One or more hardware description languages may be used in accordance with the present disclosure. Some hardware description languages may include, but are not limited to, Verilog, VHDL, SystemC, SystemVerilog and Verilog-AMS. Various other hardware description languages may also be used as well.

Figure 3:
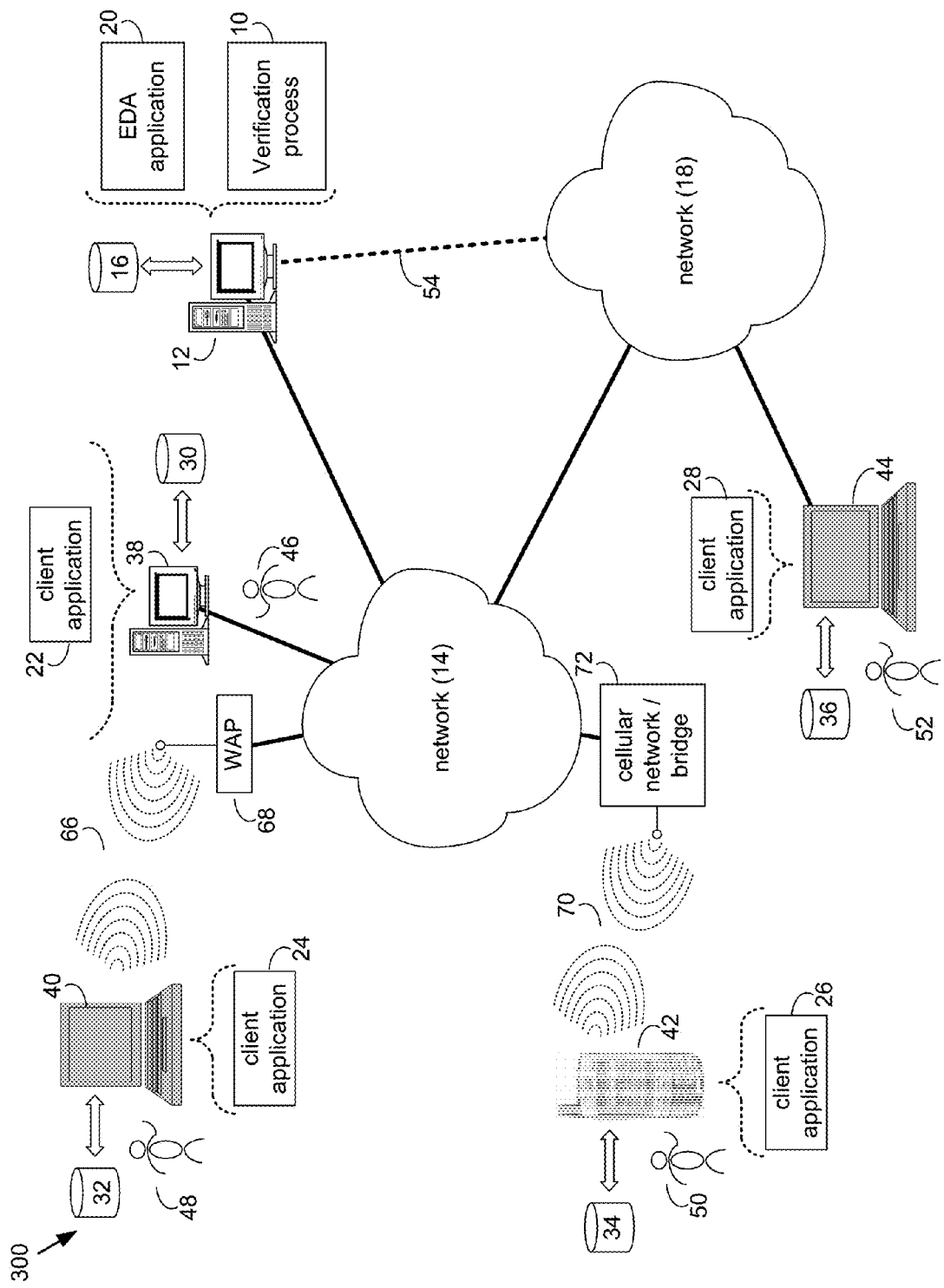
FIG. 3 is a diagram depicting an embodiment of a verification process in accordance with the present disclosure.

Referring to FIG. 3, there is shown a verification process 10 that may reside on and may be executed by server computer 12, which may be connected to network 14 (e.g., the Internet or a local area network, etc.). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell® NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally/alternatively, verification process 10 may reside on and be executed, in whole or in part, by a client electronic device, such as a personal computer, notebook computer, personal digital assistant, or the like.

The instruction sets and subroutines of verification process 10, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive; a RAID array; a random access memory (RAM); and a read-only memory (ROM). Storage device 16 may include various types of files and file types including but not limited, to hardware description language (HDL) files, which may contain, for example, port type descriptions and executable specifications of hardware blocks.

Server computer 12 may execute a web server application, examples of which may include but are not limited to: Microsoft IIS, Novell Webserver™, or Apache® Webserver, that allows for HTTP (i.e., HyperText Transfer Protocol) access to server computer 12 via network 14 (Webserver is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20), examples of which may include, but are not limited to those available from the assignee of the present application. EDA application 20 may interact with one or more EDA client applications (e.g., EDA client applications 22, 24, 26, 28) for electronic design optimization.

Verification process 10 may be a stand alone application, or may be an applet/application/script that may interact with and/or be executed within EDA application 20. In addition/as an alternative to being a server-side process, verification process 10 may be a client-side process (not shown) that may reside on a client electronic device (described below) and may interact with an EDA client application (e.g., one or more of EDA client applications 22, 24, 26, 28). Further, verification process 10 may be a hybrid server-side/client-side process that may interact with EDA application 20 and an EDA client application (e.g., one or more of client applications 22, 24, 26, 28). As such, verification process 10 may reside, in whole, or in part, on server computer 12 and/or one or more client electronic devices.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize verification process 10.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18. Further, server computer 12 (i.e., the computer that executes EDA application 20) may be connected to network 14 through secondary network 18, as illustrated with phantom link line 54.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (i.e., WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11x specifications may use Ethernet protocol and carrier sense multiple access with collision avoidance (i.e., CSMA/CA) for path sharing. The various 802.11x specifications may use phase-shift keying (i.e., PSK) modulation or complementary code keying (i.e., CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows, Microsoft Windows CE®, Red Hat Linux, or other suitable operating system. (Windows CE is a registered trademark of Microsoft Corporation in the United States, other countries, or both.).

The term "design" as used herein may refer to, but is not limited to, an integrated circuit design, or any other suitable type of electronic design, such as those associated with electronic design automation tools. For example, an electronic design may refer to a combination of hardware (e.g. described by a hardware description language) and software to implement a range of functions. The function performed by the system may be determined by the way in which the design is configured and the data is presented to the design. Numerous designs may be simulated and any number of engines of various types may be used without departing from the scope of the present disclosure.

The term "configuration information" as used herein may refer to, but is not limited to, one or more memory elements that may be configured to control the mode of functional operation of the electronic design. Values of memory elements may be changed during operation to instruct the system to perform different operations. There may be many other elements associated with the design (e.g. even memory elements that are active as data is processed), however, the memory elements (e.g. configuration registers) described herein may be configured to control the way in which the design operates (e.g. which algorithms are run) rather than being part of an algorithm.

In some embodiments, one or more of the designs may be hardware based. Additionally and/or alternatively, one or more of the designs may be software based. For example, the operation of the first design may be a hardware operation and the operation of the second design may be a software operation. Accordingly, verification process 10 may utilize hardware, software and any combination thereof. For example, the control of the configuration may come from either hardware or software. In some embodiments, hybrid hardware/software engines may be both be used without departing from the scope of the present disclosure.

In some embodiments, verification process 10 may be used to describe, measure, verify and cover the configuration space of a design. Accordingly, verification process 10 may be configured to capture the configuration of the design. This may be done using any suitable approach. For example, by analyzing a document or machine-readable file describing the configuration registers in the design, by extracting the configuration class from the design using a constraint solver example generator (such as those available from the Assignee of the present disclosure), etc.

In each of these examples, the end result is a configuration object comprising fields that may be randomized and rules (e.g., constraints) that describe the constraints and relationships between these fields. The fields in the configuration space may then be analyzed and also marked by the user to identify the mission critical fields. This provides an executable specification for the configuration of the design. A key point here is that we are looking at the configuration space not the state space. The configuration space may be many orders of magnitude smaller.

The phrase "configuration space" as used herein may refer to, but is not limited to, all reachable (or feasible) combinations of configuration parameters. The configuration space define all of the modes the design is intended to operate in. The phrase "state space" as used herein may refer to, but is not limited to, all possible combinations of state-holding elements (e.g., memories and registers) in the design. There may be far more of these than the limited number of registers which hold configuration parameters and which in turn define the configuration space. The state-holding elements may include, for example, the flip-flops used to store values of each pipeline stage's logic operations. The state-holding elements may also include, but is not limited to, any scratch pad memory, fifos, queues, in the design and may include the main memory in a computer.

In some embodiments, coverage for each field may be automatically generated (e.g., using the constraint solver example generator discussed above) and crosses for the coverage created for the mission critical fields. This executable specification (e.g., a SystemVerilog class with SystemVerilog constraints) may then be automatically run many times, in part, because it is much smaller than the code for the full design. The size of the configuration space as well as all likely and/or legal values may be calculated through mathematical methods rather than through iterative simulations.

The teachings of the present disclosure may be used in any suitable verification environment. One particular application where verification process 10 may be employed is in the context of processor verification. For example, assuming a processor has a pipeline depth of 3 and 128 instructions, then checking that every instruction has been followed through the pipeline generates 2,048,258 combinations that require testing. However, if the pipeline depth is increased to 4 the permutations rise to 2.5e8, which may be extremely difficult to verify. Validating that all of these combinations have been tested is extremely important. However, validating that the program has been read from every location in memory may not be. Generating a functional coverage cross showing that every instruction has followed every other through the pipeline is vital and may be automated using the teachings of the present disclosure. Moreover, the impact of the change on the regression may be quickly assessed without running a massive regression. In this way, coverage may be automatically generated ensuring that the new addition is not missed and unique configurations can be automatically generated ensuring that the new pipeline depth is fully covered.

Figure 4:
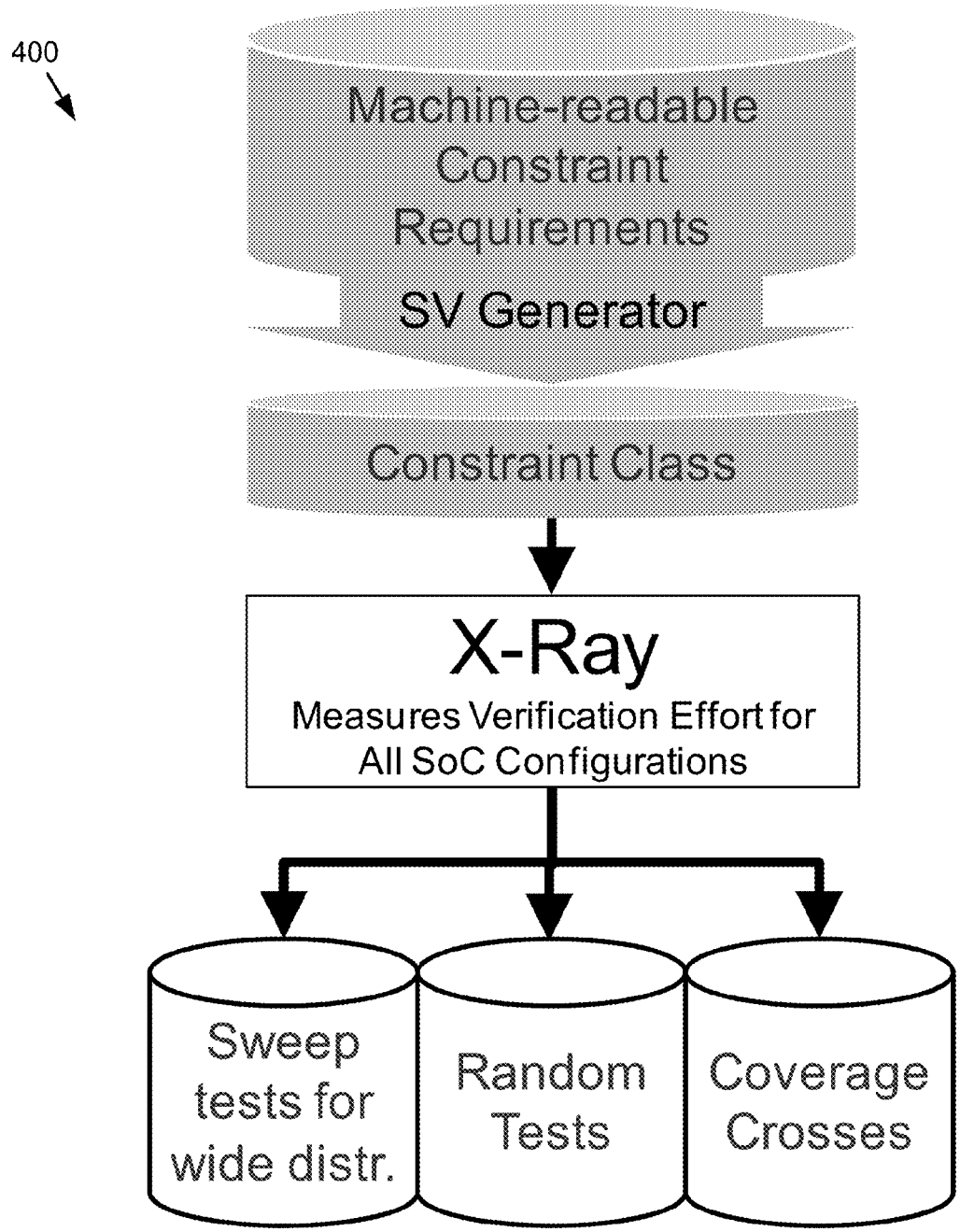
FIG. 4 is a diagram depicting an embodiment of a verification process in accordance with the present disclosure.

Referring not to FIG. 4, an embodiment of verification process 10 is provided. As discussed above, verification process 10 may be configured to calculate configuration abstraction without requiring execution of the electronic design. The constraints associated with a particular design are configured to implement product requirements. The may define interaction (configuration) among systems in a SoC. In some cases, constraints may be organized hierarchically (not necessarily by design hierarchy) and ranked in order of importance.

Embodiments of verification process 10 may be configured to determine the verification effort required for all SoC configurations. Accordingly, verification process 10 may be configured to analyze the constraints to determine the effort necessary to close aspects of the design with randomization. For example, the analysis may be run over 1000 times since no description-under-test is required. Wide distributions may be machine generated into the directed test targeted to hardware while narrow distributions may have a calculated number of tests. In some embodiments, the capacity of the farm may be divided among randomized tests mitigated by criticality of the constraint.

Figure 5:
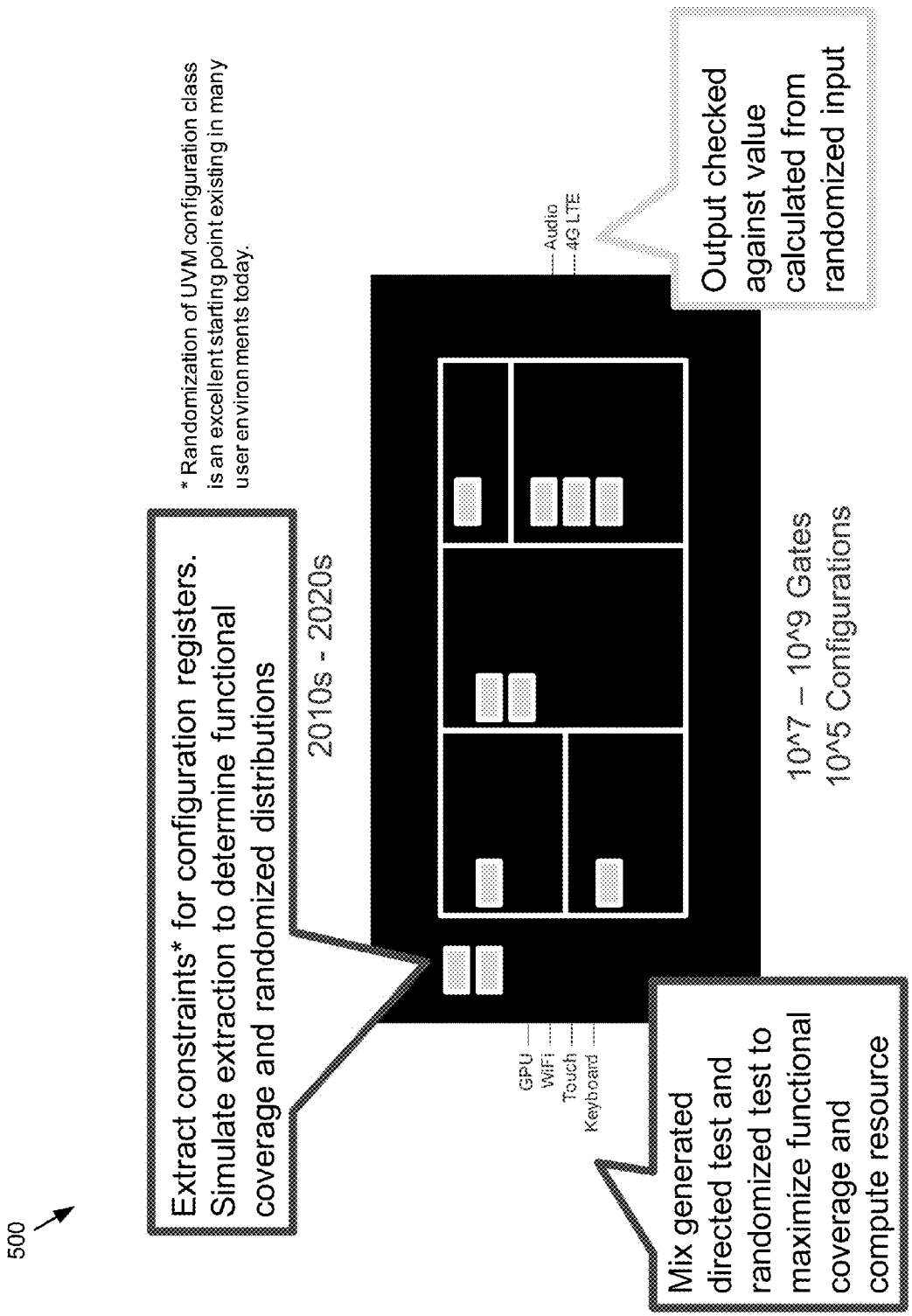
FIG. 5 is a diagram depicting an embodiment of a verification process in accordance with the present disclosure.

Referring now to FIG. 5, another embodiment consistent with verification process 10 is provided. As is shown in FIG. 5, verification process 10 may be configured to extract constraints for one or more configuration registers. In some embodiments, randomization of a configuration class (e.g., UVM) may be used as a starting point. Verification process 10 may simulate extraction to determine functional coverage and randomized distributions. In some embodiments, verification process 10 may be configured to mix one or more generated directed tests and randomized tests to maximize the functional coverage and reduce computational resources. The eventual output may be compared with the value calculated from the randomized input.

Figure 6:
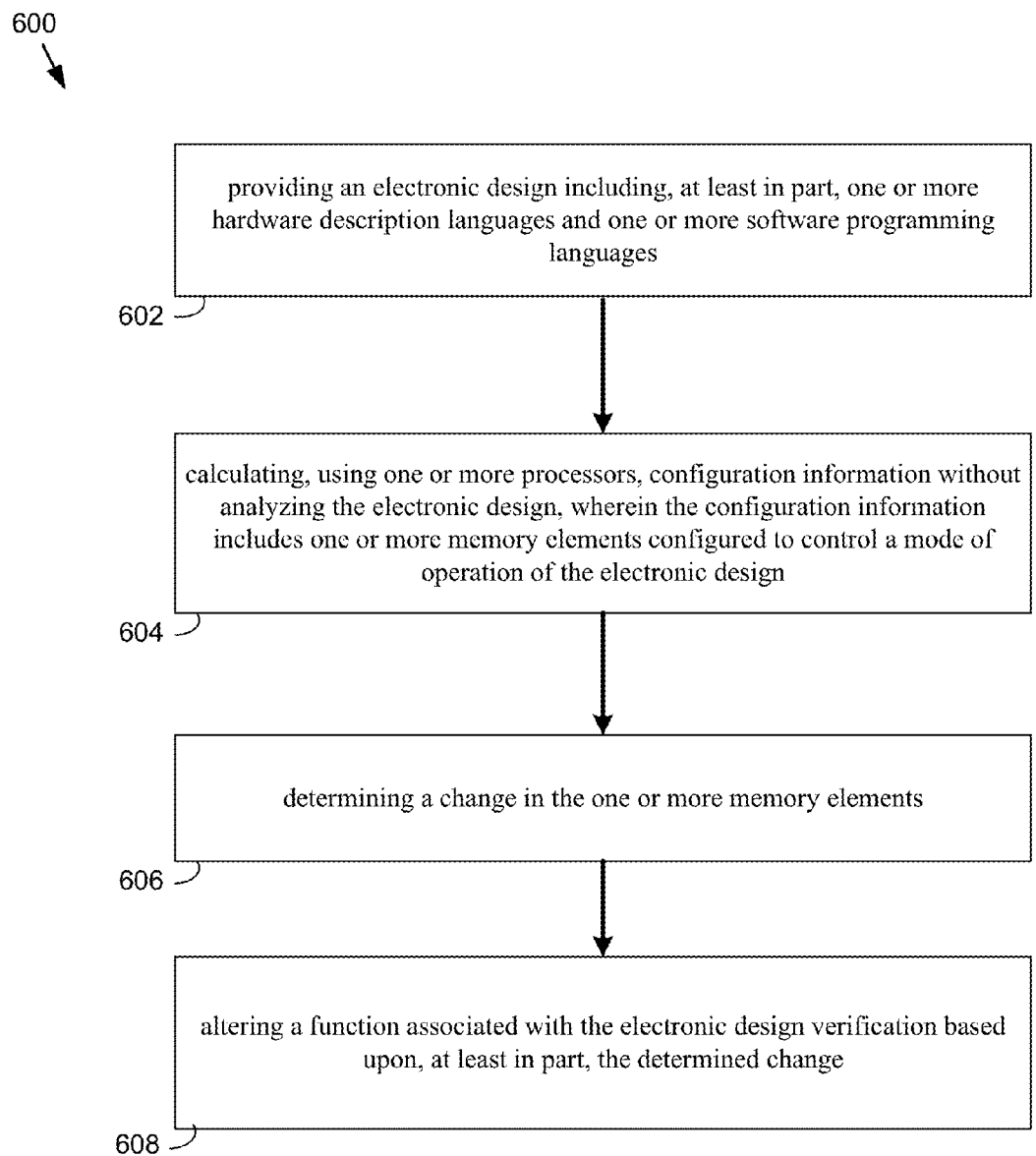
FIG. 6 is a flowchart depicting operations consistent with the verification process in accordance with an embodiment of the present disclosure.
Figure 7:
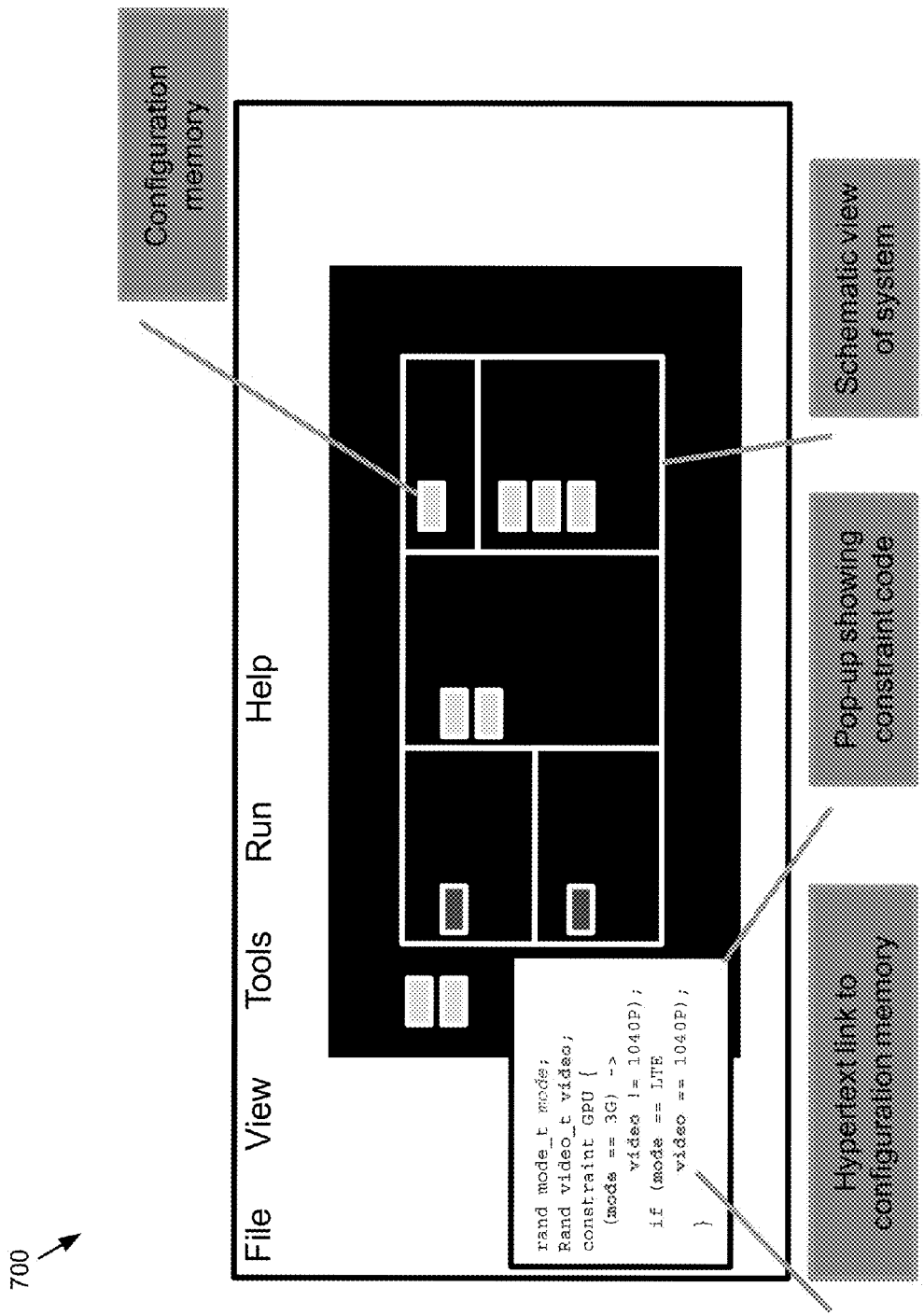
FIG. 7 is a diagram depicting an embodiment of a verification process in accordance with the present disclosure.
Figure 8:
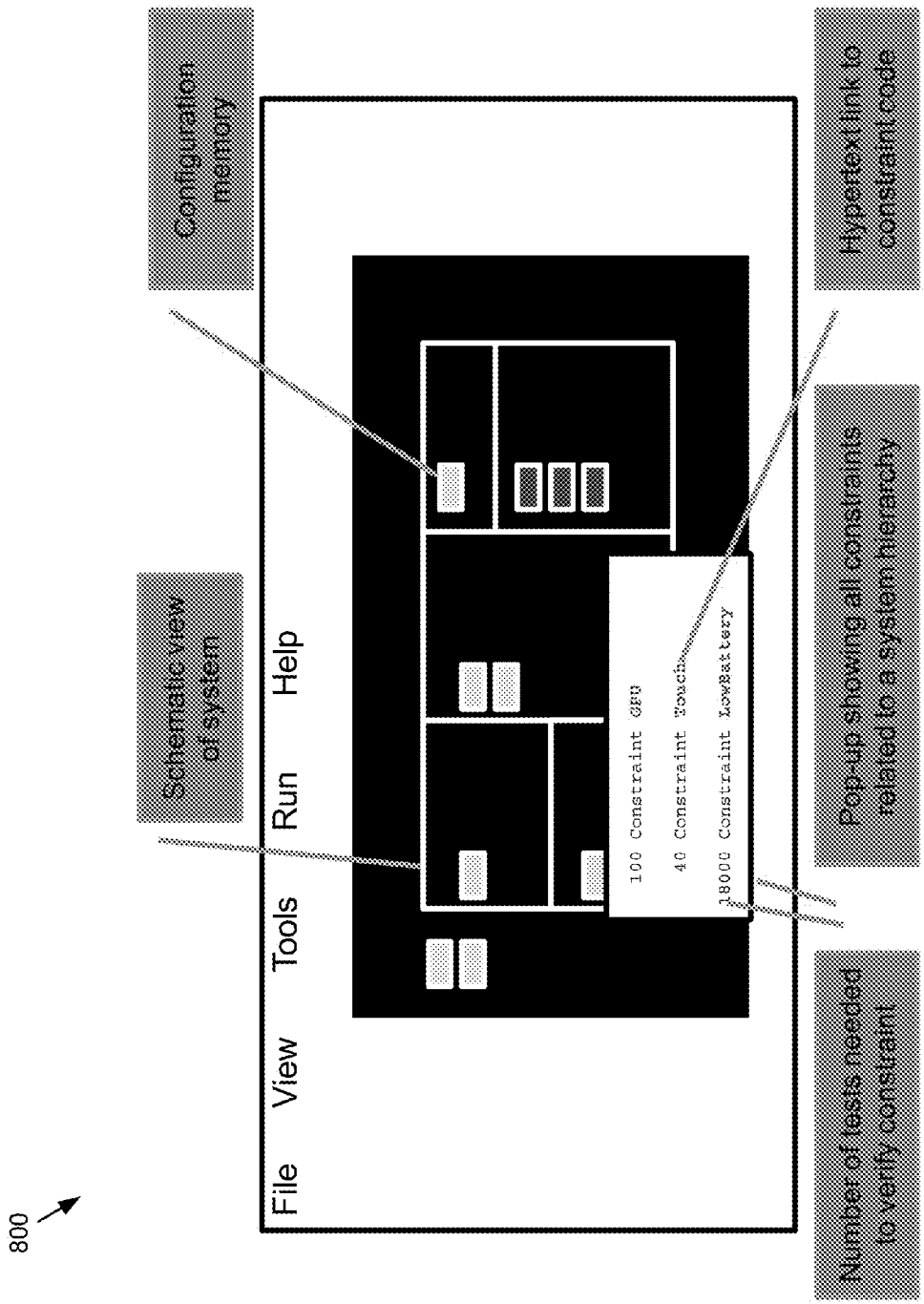
FIG. 8 is a diagram depicting an embodiment of a verification process in accordance with the present disclosure.

Referring also to FIG. 6, an exemplary flowchart 600 depicting operations consistent with verification process 10 is provided. Verification process 10 may include providing (602) an electronic design including, at least in part, one or more hardware description languages and one or more software programming languages. As discussed above, any suitable HDL or software language may be used without departing from the scope of the present disclosure. Any reference to a specific language as contained herein is made merely by way of example.

Embodiments of verification process 10 may further include calculating (604) configuration information without analyzing the electronic design, wherein the configuration information includes one or more memory elements configured to control a mode of operation of the electronic design. As discussed above, in some implementations configuration information may include one or more configuration registers. Embodiments may also include determining (606) a change in the one or more memory elements and altering (608) a function associated with the electronic design verification based upon, at least in part, the determined change.

In some embodiments, verification process 10 may be configured to estimate a potential verification effort for all possible system-on-a-chip configurations associated with the electronic design verification. The input may be a constraint class for all SoC configurations.

In some embodiments, the user may be able to identify the test capacity of a server farm in order to optimize throughput. Accordingly, in some cases, this may involve identifying sub-configurations that have a wide distribution that require a huge test count relative to farm to close. Referring again to FIG. 4, specific sweep tests may then be generated for a multi-user accelerator/emulator (such as those available from the assignee of the present disclosure) and/or for massive, parallel simulation on a server farm. In some cases, the sub-configurations that need higher coverage may be prioritized and runner code and coverage crosses may be generated.

In some embodiments, verification process 10 may enable functional coverage synthesis. In this way, coverage may only need to be written once using constraints and synthesized associated coverage cross statements. Accordingly, verification process 10 may be configured to synthesize one or more coverage cross statements based upon, at least in part, constraint-based coverage.

In some embodiments, and referring also to FIGS. 7-11, verification process 10 may be configured to enable, via a graphical user interface, a display of one or more constraints connected to one or more design-under-test modules. Accordingly, verification process 10 may allow for the display of a verification space including at least one of a schematic view of a portion of the electronic design, a configuration memory, a constraint code visualization, and a hypertext link to configuration memory. In some cases, the GUI may be used to connect constraints to DUT blocks and an associated database may be used to manage connection data. One particular embodiment depicting a visualization of farm requirements is provided in FIG. 8.

Figure 9:
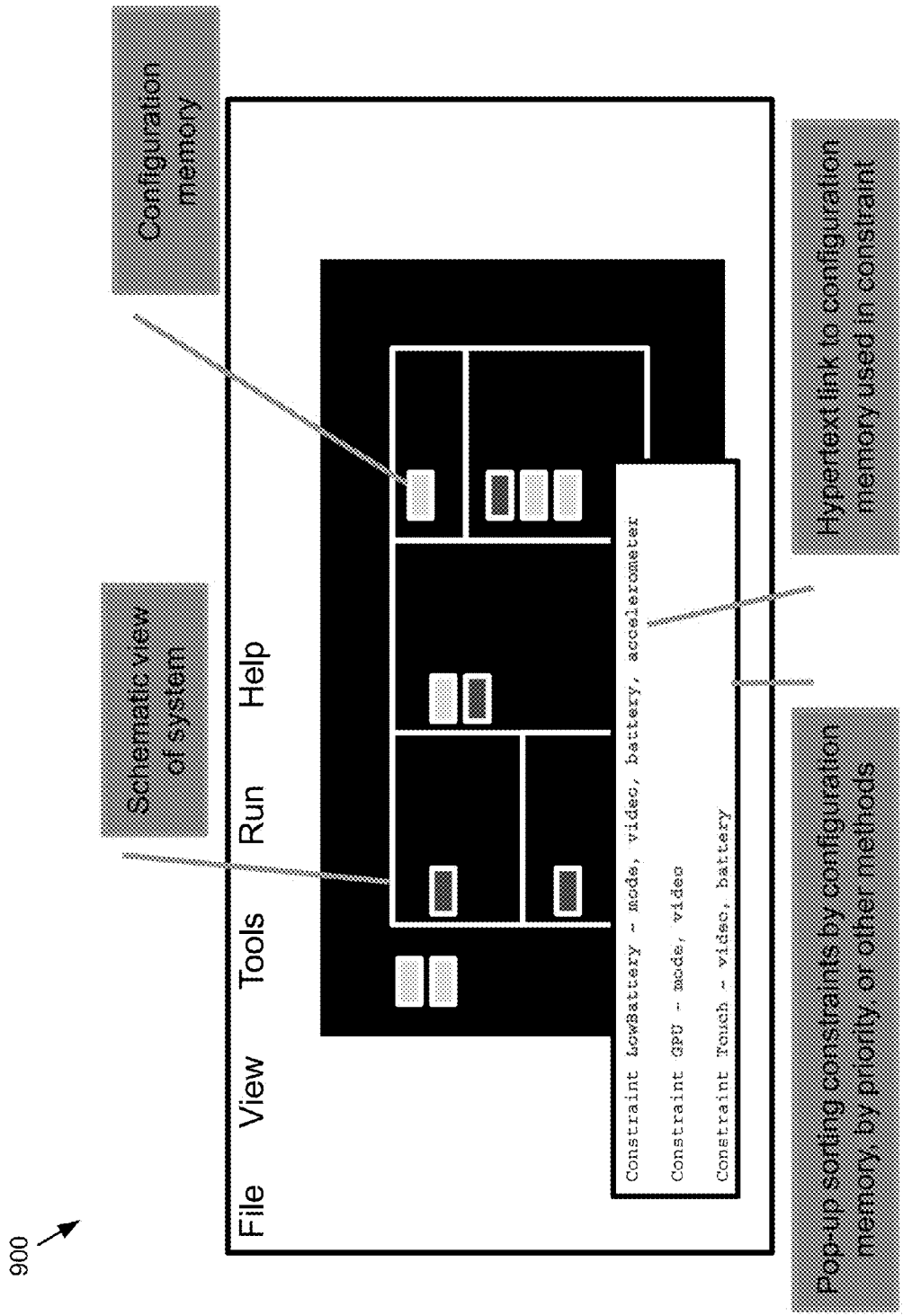
FIG. 9 is a diagram depicting an embodiment of a verification process in accordance with the present disclosure.

In some embodiments, and referring also to FIG. 9, verification process 10 may be configured to execute a single test in a configuration space prior to performing a regression analysis. In this "smoke test" verification, verification process 10 may perform a single test in each configuration first to reach SoC coverage. As depicted in the graphical user interface shown in FIG. 9, a schematic view of the system may be displayed, which may also include configuration memory. A graphical display sorting constraints by configuration memory, by priority, and/or other methods may also be employed. A hypertext link to configuration memory used in the constraint may also be included.

In some embodiments, verification process 10 may be configured to identify one or more redundant patterns associated with the electronic design verification. For example, this type of pattern filtering approach may be used to identify redundant patterns and turn off injection into the DUT once a sufficient set is run.

In some embodiments, verification process 10 may be configured to determine a subset of test runs to identify one or more unique test runs. This may provide the ability to analyze efficiency of runs. For example, by determining the percentage of runs that were unique within a farm run. In some cases, this may require the need to generate coverage crosses to show uniqueness of tests.

In some embodiments, verification process 10 may be configured to label one or more redundant patterns. Once labeled, these may be removed from the electronic design verification as desired. In this way, verification process 10 may allow for test refactoring, for example, used to mark redundant patterns so that engineers can refactor the tests and reduce the total legacy test suite.

Figure 10:
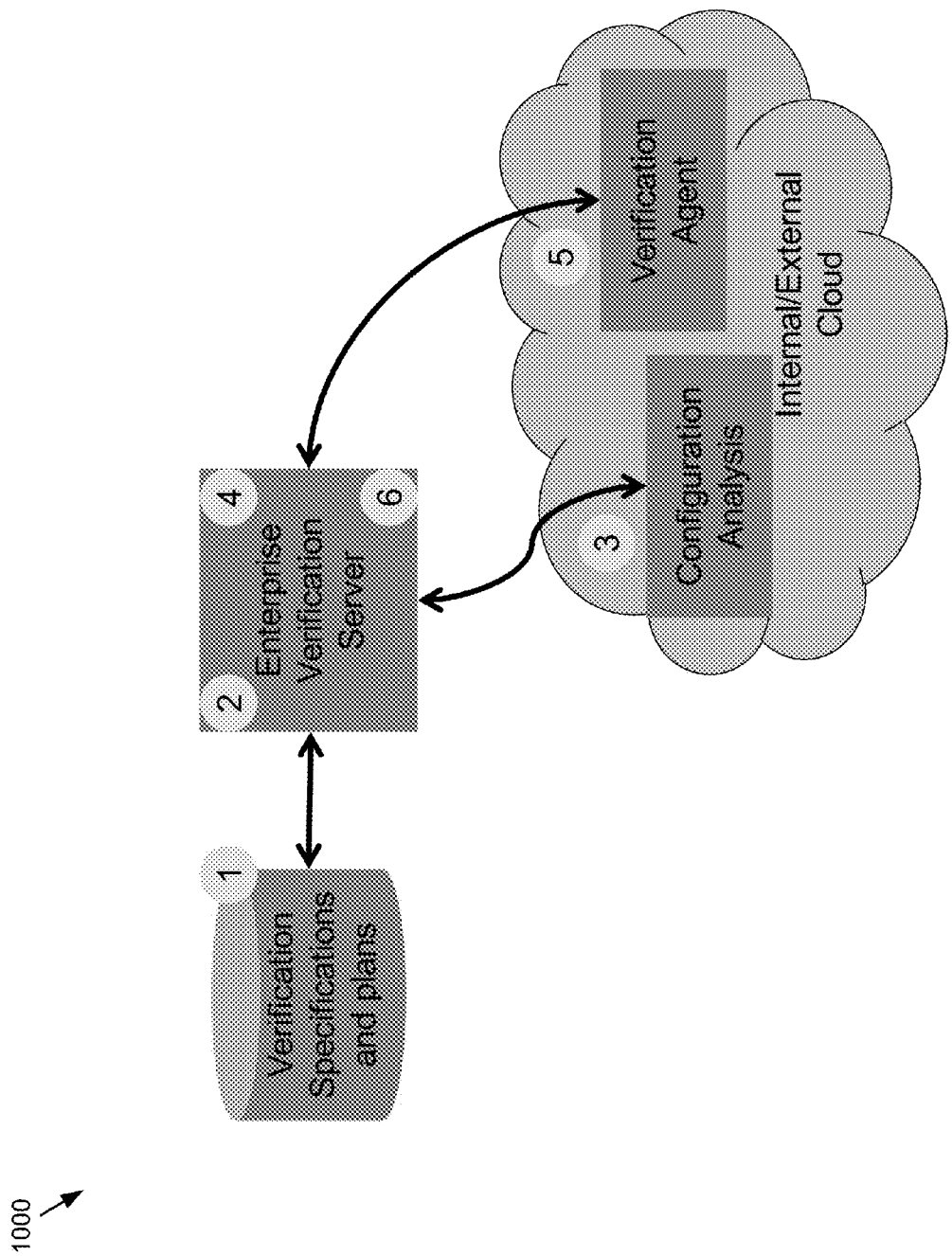
FIG. 10 is a diagram depicting an embodiment of a verification process in accordance with the present disclosure.
Figure 11:
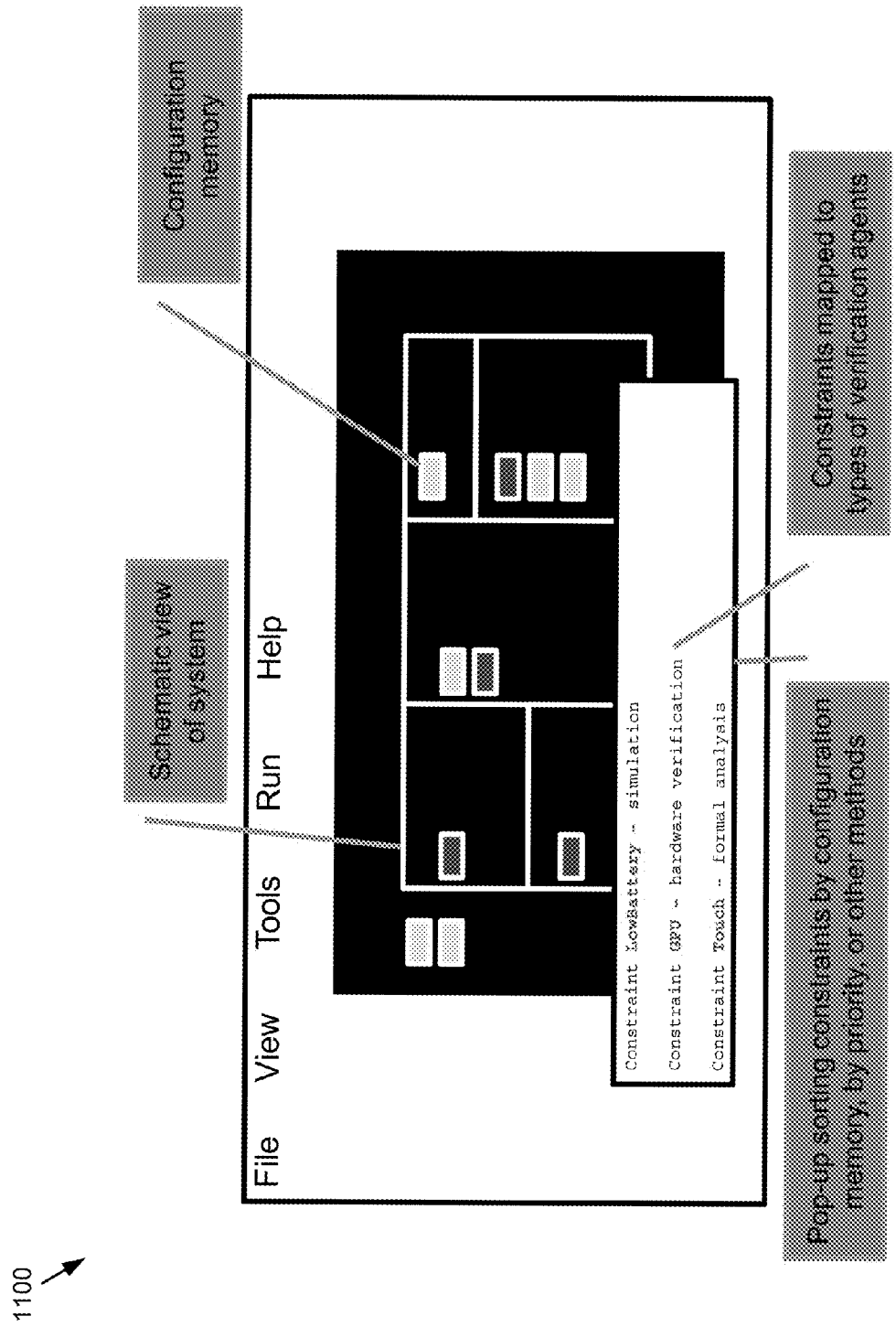
FIG. 11 is a diagram depicting an embodiment of a verification process in accordance with the present disclosure.

Referring now to FIG. 10, an embodiment depicting an example of a potential verification plan integration flow consistent with verification process 10 is shown. In some embodiments, verification process 10 may allow for the integration of manual and synthesized functional coverage results associated with the electronic design verification. This may also provide an approach for automated and efficient farm utilization. As shown in FIG. 10, in some embodiments a verification plan may be created from a system specification. The verification plan may then be prioritized in the Enterprise Verification Server. Configuration analysis organized by Enterprise Verification Server executes in an internal or external cloud compute servers, or a hybrid thereof. The verification agents execution may be optimized with this configuration analysis data before executing tests on the system. Data from the verification agents may be analyzed with the verification plan.

Accordingly, using the embodiments of verification process 10 described herein may provide a variety of different types of information. For example, the number of unique configurations found per additional hundred tests run may be obtained. This may diminish as more tests are run and gives an indication of the point where most new simulations are re-running configurations that have been run before. This information may also show how much coverage of the configuration space is achieved by running more simulations (e.g., how much coverage of the configuration space is achieved by running 1000, 2000, 3000 . . . 100,000 tests). Embodiments disclosed herein may also indicate when the configuration space is so large that running additional tests will not (within the scope of the resources available) reach the required coverage. As discussed above, embodiments of verification process 10 may also be used to create "sweep" tests that sweep though the legal (or likely) ranges of the values. These legal ranges can be calculated by keeping a database of unique configurations found when repeatedly running the solve and then passing those out as tests are launched on the grid. Additionally and/or alternatively, they may also be created mathematically using a constraint solver engine.

Accordingly, and as discussed herein, verification process 10 may provide for a transition from existing randomization approaches. Embodiments of verification process 10 may provide a number of advantages over existing technologies. Some of these may include, but are not limited to, reducing computation by orders of magnitude, optimization of server farm bandwidth, functional coverage synthesis, and complexity visualization. The abstraction discussed herein may be available for collaboration partners. For example, verification process 10 may be configured to extract constraints for manual results analysis, synthesize functional coverage, and allow for collaboration to develop detailed automation requirements.

Figure 12:
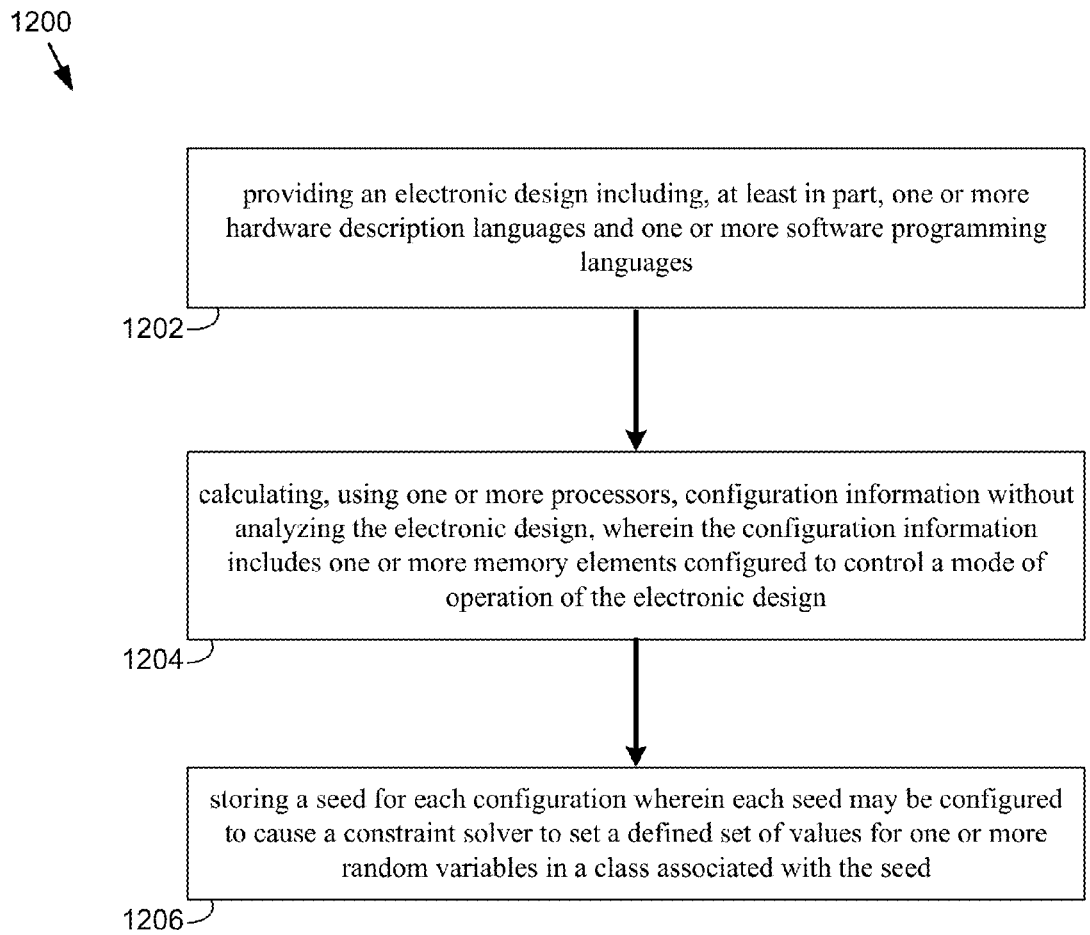
FIG. 12 is a flowchart depicting operations consistent with the verification process in accordance with an embodiment of the present disclosure.

Referring also to FIG. 12, an exemplary flowchart 1200 depicting operations consistent with verification process 10 are provided. Verification process 10 may include providing (1202) an electronic design including, at least in part, one or more hardware description languages and one or more software programming languages. As discussed above, any suitable HDL or software language may be used without departing from the scope of the present disclosure. Any reference to a specific language as contained herein is made merely by way of example.

Embodiments of verification process 10 may further include calculating (1204) configuration information without analyzing the electronic design, wherein the configuration information includes one or more memory elements configured to control a mode of operation of the electronic design. As discussed above, in some implementations configuration information may include one or more configuration registers. Embodiments may also include storing (1206) a seed for each configuration, wherein each seed may be configured to cause a constraint solver to set a defined set of values for one or more random variables in a class associated with the seed.

Accordingly, embodiments of verification process 10 may be configured to ensure that each simulation in a regression is running a unique configuration. In this way, verification process 10 may be configured to extract the configuration randomize into a testcase and then run that testcase some number of times (e.g. thousands) identifying unique legal configurations. The seed for each unique configuration for that randomize call may be stored in a database such as those shown in FIG. 3. Accordingly, embodiments of verification process 10 may be configured to provide a mechanism to the run time simulation that allows the seed to be set for a given randomize call.

In some embodiments, in operation, when a customer launches a regression all of the unique configurations may be tested first. This may increase the chance of seeing an issue quickly. This may also allow for closing coverage faster than random testing with many simulations repeating testing already performed by other tests. Embodiments of verification process 10 may also be more repeatable than purely random testing.

As discussed above, verification process 10 may allow for the constraint solver call for the configuration randomization to be extracted into a testcase. This testcase may then iterate a number (e.g., thousands) of times very quickly as discussed above. A unique database of results can then be generated. This unique database of results may then be used to run each simulation with a unique configuration initially.

Referring again to FIGS. 12-13, embodiments included herein may allow for setting the values for the configuration randomize call to unique values. Accordingly, embodiments of verification process 10 may be configured to identify all of the unique configurations for a given run. In some embodiments, verification process 10 may be configured to save the seed for that randomize call as well.

In some embodiments, the term "seed" may refer to one number that may be used as a starting point for the constraint solver engine. This seed may cause the constraint solver engine to generate the random variables in a class with the unique values we want. Each seed that provides a unique set of values may be stored.

Accordingly, in some embodiments, the constraint solver may take a given class with a set of variables (e.g., some random) and constraints and generate a set of values for the variables that satisfies the constraints. By starting the constraint solver with a specific starting point (seed) the system may know the values it will generate for the class variables.

In this way, for example, by running thousands of constraint solves on the configuration class, as discussed above, and keeping the seeds that generated unique values a list of seeds may be utilized as a starting point (seed) for the constraint solver. These may then be passed out to each simulation in the regression ensuring that each simulation in the regression gets unique values for its configuration.

It should be noted that it is not necessary to pass all the values for the class variables, which may involve a large quantity of data and the amount of data might be different as sizes of arrays are randomized. Verification process 10 provides a methodology that only involves the passing of a single seed.

As discussed above, in some embodiments, verification process 10 may be configured to enable a constraint solver to allow the seed to be set for a given constraint solver call. Accordingly, rather than sending the value for each of the class members for the configuration class to each simulation that is desired to be unique (e.g., there may be hundreds of values to pass) only the right seed for that constraint solver call may be required.

As discussed above, verification process 10 may be configured to store one or more seed values. In this way, as configuration information is calculated while the system runs and collects a database of unique legal results for the configuration randomize it may also collect and store the unique seed used to create that unique set of results. For example, with a run time command line switch all of the unique values may be loaded into the configuration class:

irun-svrnc_heartbeat 47 -svrnc_fix_seed 234576

This may indicate that for randomize call "47" the seed "234576" should be loaded. This provides a mechanism to integrate with existing customer scripts. Rather than attempting to send the path and value to the variable verification process 10 may use the constraint solver to generate the right values from a single number. As such, a compressed approach to send this data to the simulation is provided.

In some embodiments, verification process 10 may store the seed for a particular randomize call rather than for the entire simulation as this would allow for this approach to be applied for more than one randomize call in the same simulation. Additionally and/or alternatively, verification process 10 may allow for a combination of randomize calls to be running unique values. If an environment has multiple classes that control the configuration (e.g., one controls how the memory is mapped, the other the type of decoder), this would allow attempting unique values across both classes.

As discussed above, verification process 10 may be configured to generate configurations randomly therefore creating duplicate (redundant) configurations. For example, in a system that has a number of fields in its configuration that need to be chosen for each simulation in a regression, the following fields may be included:

class env_config_obj extends uvm_object;
    typedef enum {mp4, mvw, avi, h264, aac} my_decoders_t;
    typedef enum {VGA, WXGA, WUXGA, WQXGA} my_resolutions_t;
    rand my_decoders_t my_decoders;
    rand my_resolutions_t my_resolutions;
endclass Then, if five simulations are run the following simulations may be generated:

[seed: 4565654] my_decoders=mp4 my_resolution=WXGA
[seed: 3345543] my_decoders=wmv my_resolution=WQXGA
[seed: 6554445] my_decoders=aac my_resolution=VGA
[seed: 6776544] my_decoders=mp4 my_resolution=WXGA
[seed: 8655342] my_decoders=aac my_resolution=WXGA In this particular example, the first and the fourth configuration are the same which means two simulations in the regression are running very similar tests. However, some embodiments of verification process 10 may also allow for extraction of a randomize call and the running of thousands of iterations to locate the unique configurations. The constraint solver engine may be used to find all of the possible configurations in one step. Once that database of unique configurations is determined these unique configurations may be passed to each simulation. It is possible to have the simulation read a file or access the database but this may not be ideal as there may be a large quantity of data to transfer. The amount of data may also be variable, in a real example an array or memory could be randomized to a random size.

In the example provided above the seeds that the constraint solver engine used to create that particular set of values may be recorded. Accordingly, the database of unique values may be captured as a database of unique seeds, by passing the seed to the constraint solver it may provide the same values chosen. In this way, a given seed with a given class having a certain set of variables and constraints may always produce the same numbers.

In some embodiments, verification process 10 may allow for setting the values in the configuration by setting the values using the right seed and the number of the constraint solver to apply that seed to.

Figure 13:
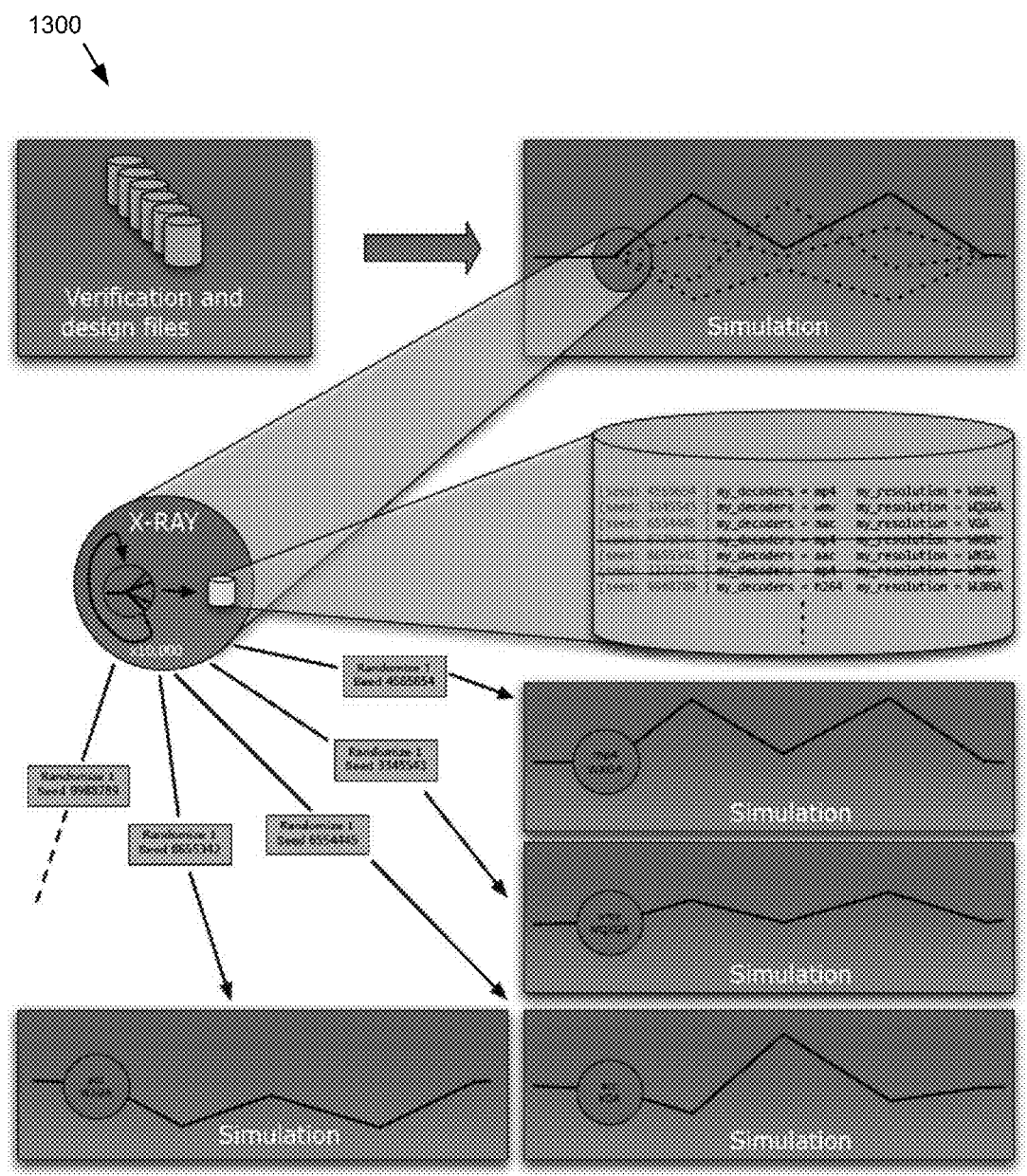
FIG. 13 is a diagram depicting an embodiment of a verification process in accordance with the present disclosure.

For example,
iron-svrnc_heartbeat 1 -svrnc_seed 4565654 my_test
may cause the configuration randomize call to generate:
my_decoders=mp4 my_resolution=WXGA In some embodiments, verification process 10 may be used to simplify the launching mechanism as the unique configurations may be provided to the simulation when it is launched (e.g., by the launching program) through a command line as shown in FIG. 13 or by some other mechanism. This approach may provide an advantage as the computing resources are not being delayed waiting on these values arriving from a database. The simulation has the information it needs to run correctly from the first moment it launches.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A computer-implemented method for electronic design verification comprising:
    providing an electronic design including, at least in part, one or more hardware description languages and one or more software programming languages;
    calculating, using one or more processors, configuration information without analyzing the electronic design, wherein the configuration information includes one or more memory elements configured to control a mode of operation of the electronic design; and
    storing a seed for each configuration, wherein each seed may be configured to cause a constraint solver to set a defined set of values for one or more random variables in a class associated with the seed
    wherein the constraint solver is configured to receive a given class with a set of variables and constraints and generate a set of values for the variables that satisfies the constraints.

2. The computer-implemented method of claim 1, further comprising:
    passing each seed to the constraint solver.

3. The computer-implemented method of claim 1, further comprising:
    matching each seed with a particular constraint solve call.

4. The computer-implemented method of claim 1, wherein storing a seed includes storing a seed associated with a constraint solve call.

5. The computer-implemented method of claim 2, further comprising:
    providing an application programming interface configured to allow for passing each seed to the constraint solver.

6. The computer-implemented method of claim 2, further comprising:
    providing an application programming interface configured to allow for storing the seed.

7. The computer-implemented method of claim 4, wherein storing includes storing each seed for each of a plurality of constraint solve calls.

8. A non-transitory computer-readable storage medium for electronic design verification, the computer-readable storage medium having stored thereon instructions that when executed by a machine result in one or more operations, the operations comprising:
    providing an electronic design including, at least in part, one or more hardware description languages and one or more software programming languages;
    calculating, using one or more processors, configuration information without analyzing the electronic design, wherein the configuration information includes one or more memory elements configured to control a mode of operation of the electronic design; and
    storing a seed for each configuration, wherein each seed may be configured to cause a constraint solver to set a defined set of values for one or more random variables in a class associated with the seed
    wherein the constraint solver is configured to receive a given class with a set of variables and constraints and generate a set of values for the variables that satisfies the constraints.

9. The computer-readable storage medium of claim 8, further comprising:
    passing each seed to the constraint solver.

10. The computer-readable storage medium of claim 8, further comprising:
    matching each seed with a particular constraint solve.

11. The computer-readable storage medium of claim 8, wherein storing a seed includes storing a seed associated with a constraint solve call.

12. The computer-readable storage medium of claim 8, further comprising:
    providing an application programming interface configured to allow for passing each seed to the constraint solver.

13. The computer-readable storage medium of claim 10, further comprising:
    providing an application programming interface configured to allow for storing the seed.

14. The computer-readable storage medium of claim 11, wherein storing includes storing each seed for each of a plurality of constraint solve calls.

15. A system for electronic design verification comprising:
    one or more processors configured to receive an electronic design including, at least in part, one or more hardware description languages and one or more software programming languages, the one or more processors further configured to calculate configuration information without analyzing the electronic design, wherein the configuration information includes one or more memory elements configured to control a mode of operation of the electronic design, the one or more processors further configured to store a seed for each configuration, wherein each seed may be configured to cause a constraint solver to set a defined set of values for one or more random variables in a class associated with the seed
    wherein the constraint solver is configured to receive a given class with a set of variables and constraints and generate a set of values for the variables that satisfies the constraints.

16. The system of claim 15, wherein the one or more processors are further configured to pass each seed to the constraint solver.

17. The system of claim 15, wherein the one or more processors are further configured to match each seed with a particular constraint solve call.

18. The system of claim 15, wherein storing a seed includes storing a seed associated with a constraint solve call.

19. The system of claim 15, wherein the one or more processors are further configured to provide an application programming interface configured to allow for storing the seed.

20. The system of claim 16, wherein the one or more processors are further configured to provide an application programming interface configured to allow for passing each seed to the constraint solver.

* * * * *